(12) United States Patent
Zang et al.

(10) Patent No.: US 10,410,929 B2
(45) Date of Patent: Sep. 10, 2019

(54) MULTIPLE GATE LENGTH DEVICE WITH SELF-ALIGNED TOP JUNCTION

(71) Applicant: GLOBALFOUNDRIES INC., Grand Cayman (KY)

(72) Inventors: Hui Zang, Guilderland, NY (US); Jianwei Peng, Latham, NY (US); Yi Qi, Niskayuna, NY (US); Hsien-Ching Lo, Guilderland, NY (US); Jerome Ciavatti, Mechanicville, NY (US); Ruilong Xie, Schenectady, NY (US)

(73) Assignee: GLOBALFOUNDRIES INC., Grand Cayman (KY)

( * ) Notice: Subject to any disclaimer, the term of this patent is extended or adjusted under 35 U.S.C. 154(b) by 82 days.

(21) Appl. No.: 15/860,840

(22) Filed: Jan. 3, 2018

(65) Prior Publication Data

US 2019/0206743 A1 Jul. 4, 2019

(51) Int. Cl.
*H01L 21/336* (2006.01)
*H01L 21/8234* (2006.01)
*H01L 29/08* (2006.01)
*H01L 27/088* (2006.01)
*H01L 29/66* (2006.01)
*H01L 21/20* (2006.01)

(52) U.S. Cl.
CPC .. *H01L 21/823487* (2013.01); *H01L 21/2018* (2013.01); *H01L 21/823418* (2013.01); *H01L 21/823456* (2013.01); *H01L 27/088* (2013.01); *H01L 29/0847* (2013.01); *H01L 29/66545* (2013.01)

(58) Field of Classification Search
CPC ........... H01L 29/7827; H01L 29/66666; H01L 21/823487; H01L 29/0847; H01L 29/78642; H01L 21/823475; H01L 21/823481; H01L 29/66795; H01L 29/785; H01L 21/823418; H01L 21/823431; H01L 27/0886; H01L 29/42392; H01L 29/6656; H01L 21/823456; H01L 21/823885; H01L 27/092; H01L 29/517; H01L 29/78; H01L 21/30604; H01L 21/823412; H01L 29/1037; H01L 29/42376; H01L 29/4966; H01L 29/518; H01L 29/6653
See application file for complete search history.

(56) References Cited

U.S. PATENT DOCUMENTS 9,653,465 B1 * 5/2017 Balakrishnan ........ H01L 27/088
9,741,716 B1 * 8/2017 Cheng ................. H01L 27/0886
9,899,515 B1 * 2/2018 Cheng ................. H01L 29/7827
10,147,648 B1 * 12/2018 Zang ............... H01L 21/823431

* cited by examiner

*Primary Examiner* — Robert G Bachner
(74) *Attorney, Agent, or Firm* — David Cain; Hoffman Warnick LLC

(57) ABSTRACT

A method of manufacturing a vertical fin field effect transistor includes forming a first fin in a first device region of a substrate, forming a second fin in a second device region of the substrate, and forming a sacrificial gate having a first gate length adjacent to the first and second fins. After forming a block mask over the sacrificial gate within the first device region, a deposition step or an etching step is used to increase or decrease the gate length of the sacrificial gate within the second device region. Top source/drain junctions formed over the fins are self-aligned to the gate in each of the first and second device regions.

19 Claims, 13 Drawing Sheets

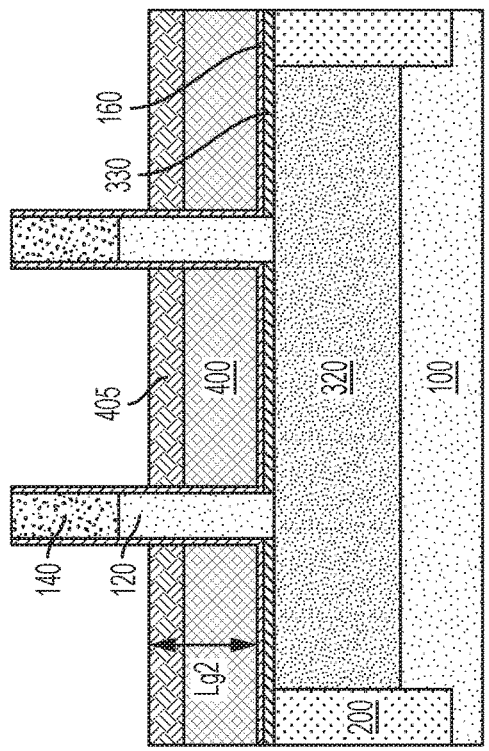
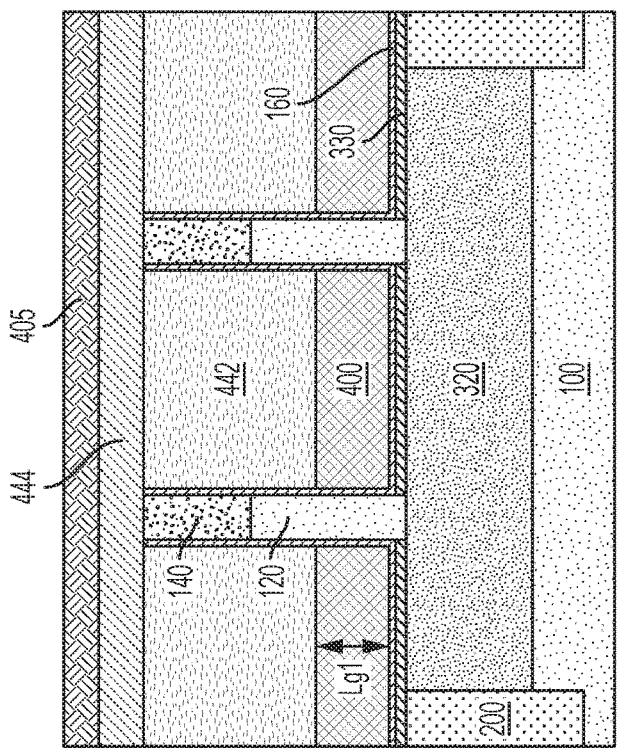
FIG. 6B
FIG. 6A

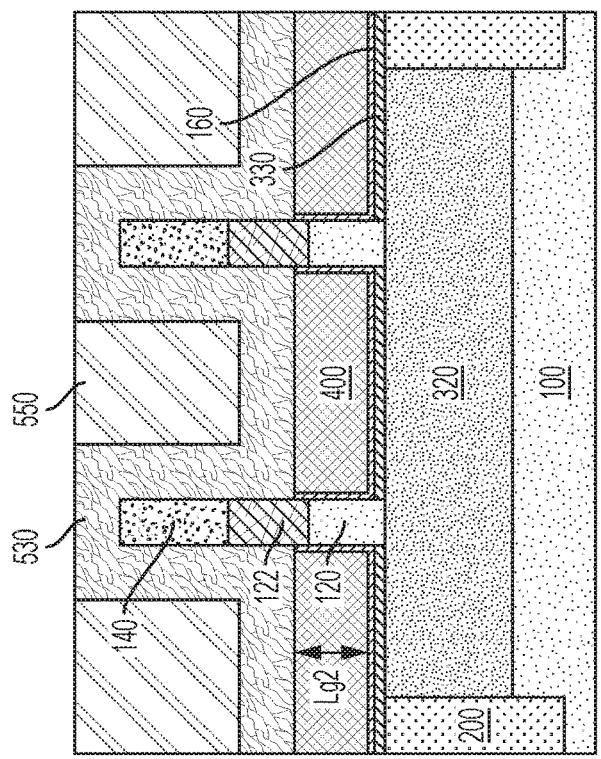
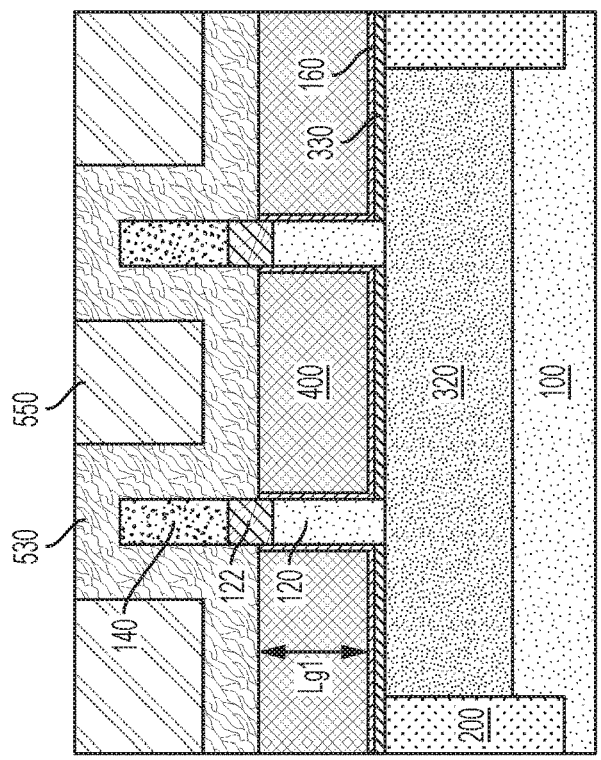

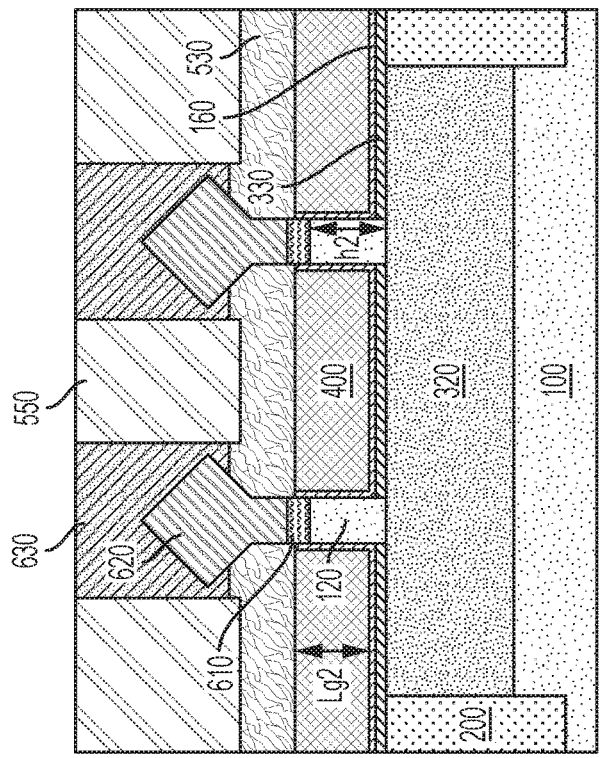
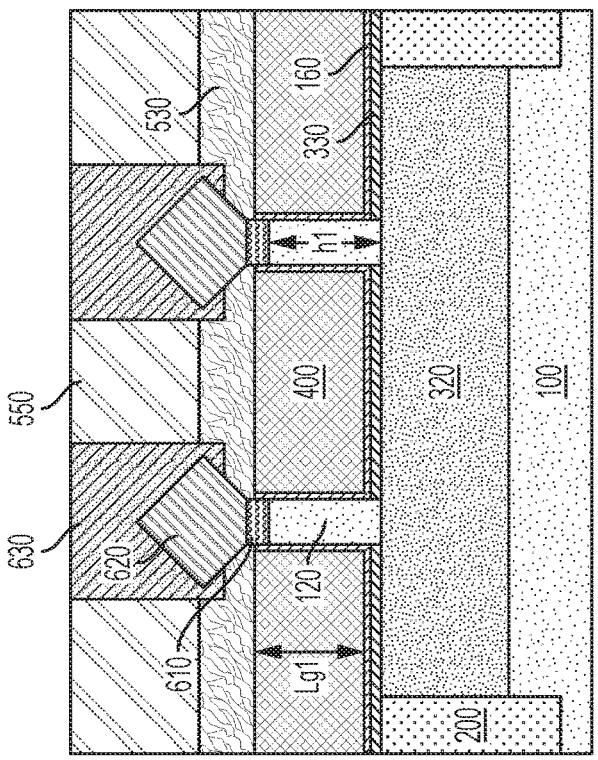

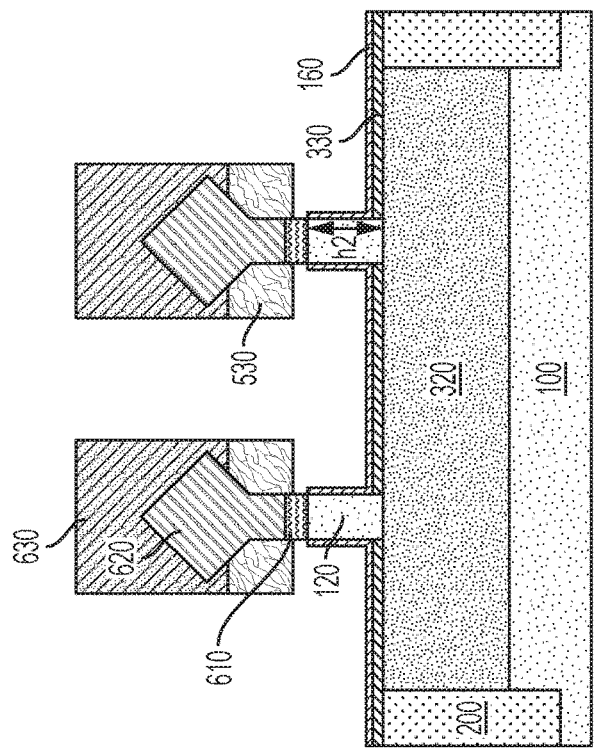
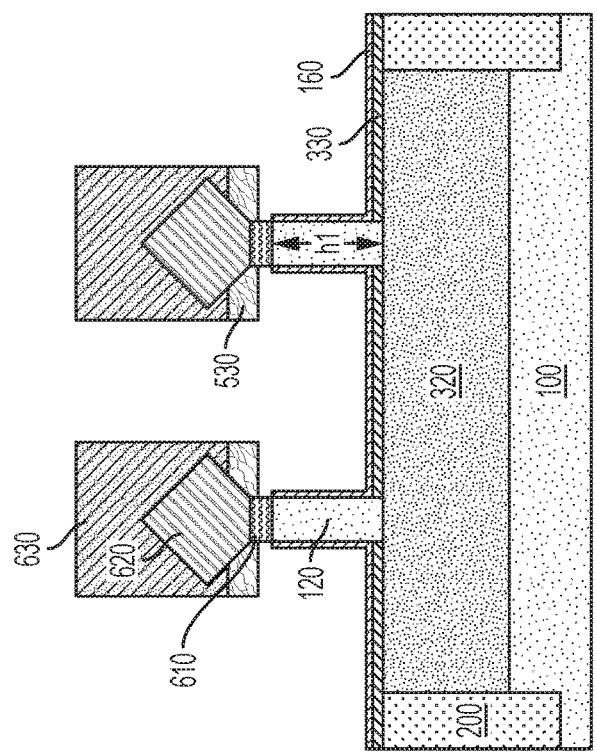
FIG. 12B
FIG. 12A

MULTIPLE GATE LENGTH DEVICE WITH SELF-ALIGNED TOP JUNCTION

BACKGROUND

The present application relates generally to semiconductor devices, and more specifically to vertical field effect transistors (VFETs) and their methods of production.

Vertical fin FETs are devices where the source-drain current flows from a source region to a drain region through a channel region of a semiconductor fin in a direction normal to a substrate surface. An advantage of the vertical FET is that the channel length is not defined by lithography, but by methods such as epitaxy or layer deposition, which enable precise dimensional control. In vertical fin field effect transistor (FinFET) devices, the fin defines the transistor channel with the source and drain regions located at opposing (i.e., upper and lower) ends of the fin.

The vertical fin field effect transistor structure can be used to form a wide variety of devices, including long channel and short channel devices. Fins having different heights may be used to locally define the channel length of different devices on the same substrate. However, notwithstanding recent developments, it remains a challenge to form semiconductor fins on the same substrate having different fin heights (and different channel lengths), and to subsequently form top source/drain junctions that are aligned to respective ones of the fins.

SUMMARY

Depending on the product application, it may be desirable to produce different device geometries, such as a combination of first and second finFET devices where, for example, the first devices have a first gate length (Lg1) and the second finFET devices have a second gate length (Lg2) that is different than the first gate length (Lg1), i.e., wimpy FinFET devices. Disclosed are methods of manufacturing multiple gate length vertical FinFET devices having a self-aligned top source/drain junction.

In exemplary structures a first device, e.g., a long channel device, within a first device region of a substrate has a first gate length, and a second device, e.g., a short channel device, within a second device region of a substrate has a second gate length less than the first gate length. In such a structure, a top surface of the first gate is disposed above a top surface of the second gate, and the top source/drain junctions for each device are self-aligned to the respective gate.

In accordance with embodiments of the present application, a method of making a vertical FinFET device includes forming a plurality of fins over a semiconductor substrate, forming a bottom source/drain region over the substrate and adjacent to the fins, forming a sacrificial gate having a first gate length over the substrate and surrounding the fins, forming a block mask over the sacrificial gate within a first device region of the substrate, and modifying the sacrificial gate within a second device region of the substrate to form a second gate length different from the first gate length.

Thereafter, portions of the fins disposed above the sacrificial gate are treated form treated regions that are etched (i.e., removed) selectively with respect to untreated regions of the fins. A top source/drain region is then formed over the untreated regions of the fins.

A further method includes forming a plurality of fins over a semiconductor substrate, forming a bottom source/drain region over the substrate and adjacent to the fins, forming a sacrificial gate having a first gate length over the substrate and surrounding the fins, and forming a block mask over the sacrificial gate within a first device region of the substrate.

The method also includes modifying the sacrificial gate within a second device region of the substrate to form a second gate length different from the first gate length, removing the block mask from within the first device region, treating portions of the fins disposed above the sacrificial gate within the first and the second device regions after modifying the sacrificial gate within the second device region to form treated regions, etching the treated regions of the fins selectively with respect to untreated regions of the fins to remove the treated regions, forming a top source/drain region over the untreated regions of the fins, removing the sacrificial gate from within the first and second device regions, and forming a gate stack over sidewalls of the fins, wherein the gate stack comprises a gate dielectric layer formed directly over the fins and a gate conductor formed over the gate dielectric layer.

Self-aligned top source/drain junctions may be formed over the fins in each of the first and second device regions. The top source/drain junction may be formed after selectively etching a top portion of the fins to define the fin height. Localized doping of the fins, for example, may be used to create top regions of the fins that can be etched selectively with respect to bottom (un-doped) regions of the fins.

According to further embodiments, a vertical FinFET device includes a first device region having first fin and a first gate disposed over sidewalls of the first fin having a first gate length, and a second device region having a second fin and a second gate disposed over sidewalls of the second fin having a second gate length different from the first gate length. A first source/drain junction is disposed over the first fin and self-aligned to the first gate, and a second source/drain junction disposed over the second fin and self-aligned to the second gate.

A further method of making a vertical FinFET device includes forming a plurality of fins over a semiconductor substrate in a first and a second device region, forming a bottom source/drain region over the substrate and adjacent to the fins, forming a sacrificial gate having a first gate length over the substrate and surrounding the fins, and modifying the sacrificial gate within the second device region of the substrate to have a second gate length different from the first gate length within the first device region.

The method further includes removing portions of the fins disposed above the sacrificial gate, forming a top source/drain region over remaining portions of the fins, removing the sacrificial gate from within the first and second device regions, and forming a gate stack over sidewalls of the fins, wherein the gate stack comprises a gate dielectric layer formed directly over the fins and a gate conductor formed over the gate dielectric layer.

BRIEF DESCRIPTION OF SEVERAL VIEWS OF THE DRAWINGS

The following detailed description of specific embodiments of the present application can be best understood when read in conjunction with the following drawings, where like structure is indicated with like reference numerals and in which:

FIG. 6A shows the formation of a dielectric layer over the lithography stack within the first device region according to certain embodiments;

FIG. 6B shows the formation of a supplemental sacrificial gate layer directly over the sacrificial gate within the second device region according to certain embodiments;

FIG. 8A shows the formation of a top spacer layer over the fins and over the fin hard mask, and the subsequent deposition and planarization of an interlayer dielectric;

FIG. 8B shows the formation of a top spacer layer over the fins and over the fin hard mask, and the subsequent deposition and planarization of an interlayer dielectric;

FIG. 11A depicts the formation of a top source/drain junction over each fin, and the formation of a capping layer over each top source/drain junction;

FIG. 11B depicts the formation of a top source/drain junction over each fin, and the formation of a capping layer over each top source/drain junction;

FIG. 12A shows removal of the interlayer dielectric, portions of the top spacer layer, and the sacrificial gate within the first device region;

FIG. 12B shows removal of the interlayer dielectric, portions of the top spacer layer, and the sacrificial gate within the second device region;

DETAILED DESCRIPTION

Figure 1B:
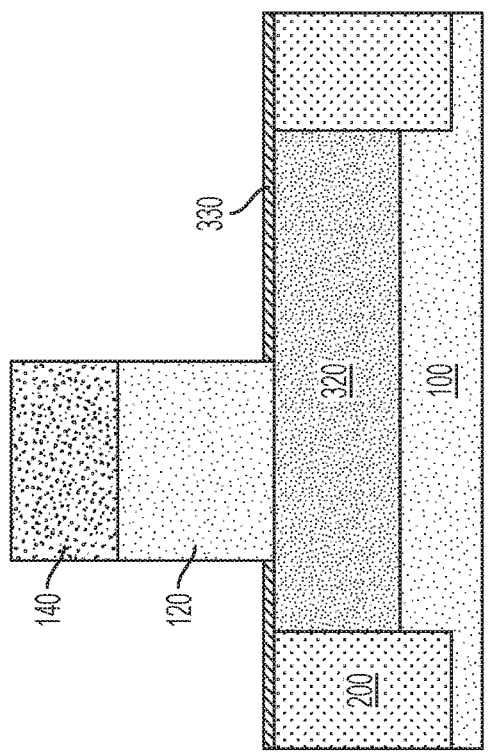
FIG. 1B is a cross-sectional schematic diagram taken transverse to the diagram of FIG. 1A showing a cut semiconductor fin disposed over the semiconductor substrate.

Reference will now be made in greater detail to various embodiments of the subject matter of the present application, some embodiments of which are illustrated in the accompanying drawings. The same reference numerals will be used throughout the drawings to refer to the same or similar parts.

Disclosed herein are vertical FinFET structures having different gate lengths. The vertical FinFETs each have top source/drain junction that is self-aligned to a respective gate. Exemplary methods and corresponding structures are described herein with particular reference to FIGS. 1-13.

Figure 1A:
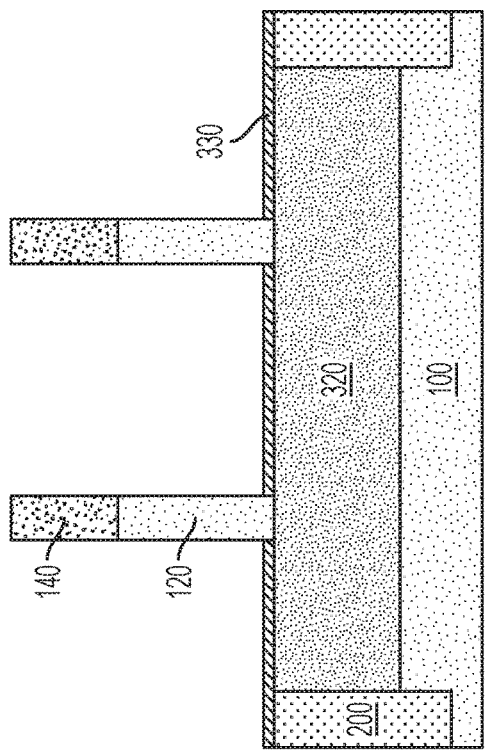
FIG. 1A is a cross-sectional schematic diagram of a vertical FinFET device at an intermediate stage of fabrication according to one embodiment after the formation of an array of fins, a bottom source/drain junction, and a bottom spacer layer over a semiconductor substrate.

Referring to FIG. 1A and FIG. 1B, cross-sectional schematic diagrams of a vertical FinFET structure at an intermediate stage of fabrication include a pair of fins 120 formed over a semiconductor substrate 100. A cross-section taken orthogonal to a length direction of the fins 120 is shown in FIG. 1A, while a transverse cross-section taken parallel to a length direction of the fins 120 is shown in FIG. 1B. In several embodiments, the fins 120 are etched from, and are therefore contiguous with the semiconductor substrate 100.

The substrate 100 may include a semiconductor material such as silicon (Si), e.g., single crystal Si or polycrystalline Si, or a silicon-containing material. Silicon-containing materials include, but are not limited to, single crystal silicon germanium (SiGe), polycrystalline silicon germanium, silicon doped with carbon (Si:C), amorphous Si, as well as combinations and multi-layers thereof. As used herein, the term "single crystal" denotes a crystalline solid, in which the crystal lattice of the entire solid is substantially continuous and substantially unbroken to the edges of the solid with substantially no grain boundaries.

The substrate 100 is not limited to silicon-containing materials, however, as the substrate 100 may include other semiconductor materials, including Ge and compound semiconductors, including III-V compound semiconductors such as GaAs, InAs, GaN, GaP, InSb, ZnSe, and ZnS, and II-VI compound semiconductors such as CdSe, CdS, CdTe, ZnSe, ZnS and ZnTe.

Semiconductor substrate 100 may be a bulk substrate or a composite substrate such as a semiconductor-on-insulator (SOI) substrate that includes, from bottom to top, a handle portion, an isolation layer (e.g., buried oxide layer) and a semiconductor material layer. In the illustrated embodiment, only the topmost semiconductor material layer of such a substrate is shown.

Substrate 100 may have dimensions as typically used in the art and may include, for example, a semiconductor wafer. Example wafer diameters include, but are not limited to, 50, 100, 150, 200, 300 and 450 mm. The total substrate thickness may range from 250 microns to 1500 microns, although in particular embodiments the substrate thickness is in the range of 725 to 775 microns, which corresponds to thickness dimensions commonly used in silicon CMOS processing. The semiconductor substrate 100 may be a (100)-oriented silicon wafer or a (111)-oriented silicon wafer, for example.

Semiconductor fins 120 may be defined by a patterning process such as photolithography, which includes forming a hard mask 140 over the substrate and forming a layer of photoresist material (not shown) atop the hard mask 140. Hard mask layer 140 may include a material such as, for example, silicon nitride or silicon oxynitride, and may be deposited using conventional deposition processes, such as, for example, CVD or plasma-enhanced CVD (PECVD).

The deposited photoresist is then subjected to a pattern of irradiation, and the exposed photoresist material is developed utilizing a conventional resist developer. The pattern provided by the patterned photoresist material is thereafter transferred into the hard mask 140 and then into the substrate 100 utilizing at least one pattern transfer etching process.

Examples of etching processes that can used to transfer the pattern may include dry etching (i.e., reactive ion etching, plasma etching, and ion beam etching or laser ablation) and/or a chemical wet etch process. In one example, the etch process used to transfer the pattern may include one or more reactive ion etching steps.

As known to those skilled in the art, according to further embodiments, the fin formation process may include a sidewall image transfer (SIT) process or a double patterning (DP) process.

Each of the fins 120 may have a height (h) ranging from 5 nm to 100 nm, e.g., 5, 10, 20, 50, or 100 nm, including ranges between any of the foregoing values, and width (w) of less than 20 nm, e.g., 3, 5, 8, 10, 12 or 15 nm, including ranges between any of the foregoing values. Thus, the fins 120 define an inter-fin spacing (S) or gap between sidewalls of adjacent fins. The pitch (d), i.e., repeat distance, between adjacent fins 120 may range from 10 nm to 60 nm, e.g., 10, 20, 30, 40, 50 or 60 nm, including ranges between any of the foregoing values, where d=S+w. Although a pair of fins are shown, the present disclosure is not limited to only this example. It is noted that any number of fins 120 may be formed over the semiconductor substrate 100. According to various embodiments, plural fins are typically oriented parallel to each other and perpendicular to the library logic flow of a circuit.

After etching the semiconductor substrate 100 to form fins 120, isolation regions 200 such as shallow trench isolation (STI) regions may be formed in substrate 100, i.e., between fins 120, by etching regions of the substrate 100 to form trenches that are back-filled with a dielectric layer. For instance, isolation regions may include an oxide such as silicon dioxide. Shallow trench isolation (STI) 200 may be used to provide electrical isolation between the fins 120 and between adjacent devices as is needed for the circuit(s) being implemented.

A bottom source/drain junction 320 is disposed over and/or within the substrate proximate to a lower portion of each fin 120. Bottom source/drain junction 320 may be formed by selective epitaxial growth from substrate 100 or by ion implantation.

The terms "epitaxy," "epitaxial" and/or "epitaxial growth and/or deposition" refer to the growth of a semiconductor material layer on a deposition surface of a semiconductor material, in which the semiconductor material layer being grown assumes the same crystalline habit as the semiconductor material of the deposition surface. For example, in an epitaxial deposition process, chemical reactants provided by source gases are controlled and the system parameters are set so that depositing atoms alight on the deposition surface and remain sufficiently mobile via surface diffusion to orient themselves according to the crystalline orientation of the atoms of the deposition surface.

Example epitaxial growth processes include low energy plasma deposition, liquid phase epitaxy, molecular beam epitaxy, and atmospheric pressure chemical vapor deposition. An example silicon epitaxial process uses a gas mixture including $H_2$ and silane ($SiH_4$) or dichlorosilane ($SiH_2Cl_2$) at a deposition (e.g., substrate) temperature of 450-800° C. and a growth pressure (i.e., chamber pressure) of 0.1-700 Torr.

The foregoing processes may be modified to form a silicon germanium ($SiGe_x$) epitaxial bottom source/drain junction. During such a process, a germanium source such as germane gas ($GeH_4$) flows concurrently into a process chamber with a silicon source and a carrier gas (e.g., $H_2$ and/or $N_2$). By way of example, the flow rate of the silicon source may be in the range of 5 sccm to 500 sccm, the flow rate of the germanium source may be in the range of 0.1 sccm to 10 sccm, and the flow rate of the carrier gas may be in the range of 1,000 sccm to 60,000 sccm, although lesser and greater flow rates may be used. By way of example, the germanium content of a silicon germanium ($SiGe_x$) source/drain junction 320 may be in the range of 25 to 50 atomic percent.

Referring still to FIGS. 1A and 1B, a bottom spacer layer 330 is then formed over the shallow trench isolation and over a top surface of the substrate 100, i.e., directly over exposed portions of the bottom source/drain junctions 320.

In various embodiments, formation of the bottom spacer layer 330 includes a conformal deposition process followed by the patterned removal of the spacer layer from over the top and sidewall surfaces of the fins 120, e.g., using an organic planarization layer (OPL) as an etch mask. In such embodiments, the protective organic planarization layer (not shown) is deposited over horizontal surfaces of the bottom spacer layer 330 proximate to the substrate.

As used here, "horizontal" refers to a general direction along a primary surface of a substrate, and "vertical" is a direction generally orthogonal thereto. Furthermore, "vertical" and "horizontal" are generally perpendicular directions relative to one another independent of orientation of the substrate in three-dimensional space.

The thickness of the bottom spacer layer 330 may range from 1 to 20 nm, e.g., 1, 2, 5, 10 or 20 nm, including ranges between any of the foregoing values. The bottom spacer layer 330 may include, for example, silicon dioxide ($SiO_2$). Alternatively, bottom spacer layer 330 may include other dielectric materials such as silicon nitride, silicon oxynitride, a low-k material, or any suitable combination of these materials.

As used herein, the compounds silicon dioxide and silicon nitride have compositions that are nominally represented as $SiO_2$ and $Si_3N_4$, respectively. The terms silicon dioxide and silicon nitride, refer to not only these stoichiometric compositions, but also to oxide and nitride compositions that deviate from the stoichiometric compositions.

Exemplary "low-k" materials include but are not limited to, amorphous carbon, fluorine-doped oxides, carbon-doped oxides, SiCOH or SiBCN. Commercially-available low-k dielectric products and materials include Dow Corning's SiLK™ and porous SiLK™ Applied Materials' Black Diamond™, Texas Instrument's Coral™ and TSMC's Black Diamond™ and Coral™. As used herein, a low-k material has a dielectric constant less than that of silicon dioxide. Bottom spacer layer 330 is adapted to isolate the bottom source/drain junction from a later-formed gate.

Figure 2A:
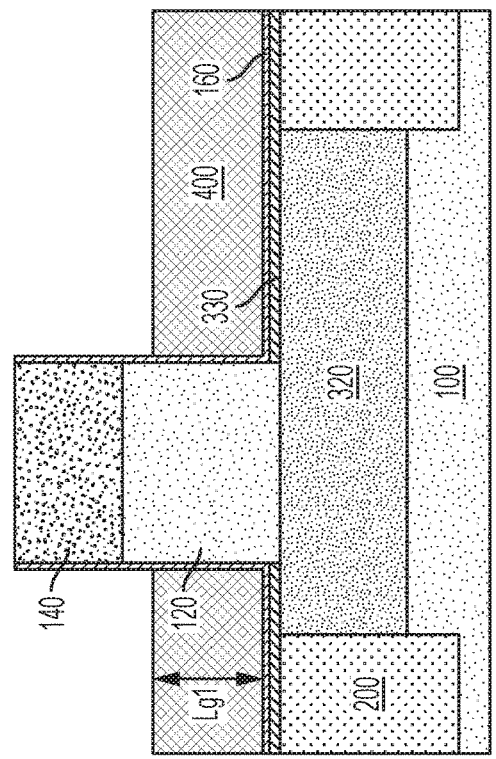
FIG. 2A shows the structure of FIG. 1A following the deposition of an extended gate (EG) oxide layer over the fins and the formation of a sacrificial gate from a layer of amorphous silicon.
Figure 2B:
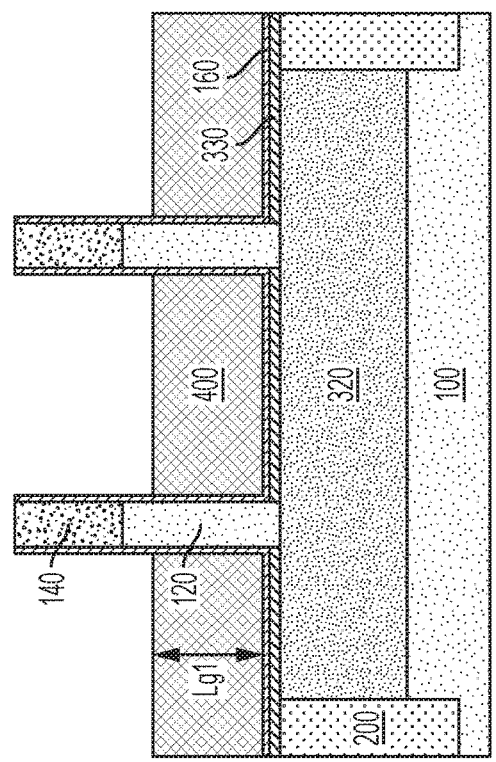
FIG. 2B shows the structure of FIG. 1B following the deposition of the EG oxide layer over the fin and the formation, polishing and etching of the amorphous silicon layer to define a sacrificial gate having a first gate length.

Referring to FIG. 2A and FIG. 2B, exposed portions of the fins 120, as well as the overlying hard mask 140, may be coated with a thin conformal oxide layer, which is referred to herein as an extended gate or EG oxide layer 160. The EG oxide layer 160 may include silicon dioxide, for example, and may have a thickness of 2 to 3 nm. During the course of manufacturing the FinFET device(s), the EG oxide 160 may be stripped from source and drain regions of a fin and/or a channel region of a fin.

A sacrificial amorphous silicon layer 400 is then deposited over substrate and over the fins 120 and patterned to form a sacrificial gate that laterally surrounds the fins. One embodiment of a method for depositing amorphous silicon includes placing the substrate 100 into a chemical vapor deposition (CVD) reactor, and exposing the substrate to a silicon-containing gas. An example silicon-containing gas is silane ($SiH_4$), although other silicon-containing gases, including other members of the silane family such as disilane ($Si_2H_6$), may be used. A sacrificial layer of amorphous silicon 400 may be formed at a deposition (substrate) temperature in the range 200-550° C. at a deposition pressure in the range of 100 mTorr to 100 Torr. The amorphous silicon layer 400 may be planarized and etched back to form a layer having a uniform thickness. As used herein, a "uniform" thickness varies by less than 5%, e.g., less than 2% or less than 1%. The thickness of the amorphous silicon layer 400 defines a first gate length Lg1. In various embodiments, a top surface of the recessed sacrificial gate 400 is below a top surface of the fins 120.

"Planarization" and "planarize" as used herein refer to a material removal process that employs at least mechanical forces, such as frictional media, to produce a substantially two-dimensional surface. A planarization process may include chemical mechanical polishing (CMP) or grinding. Chemical mechanical polishing (CMP) is a material removal process that uses both chemical reactions and mechanical forces to remove material and planarize a surface.

Figure 3B:
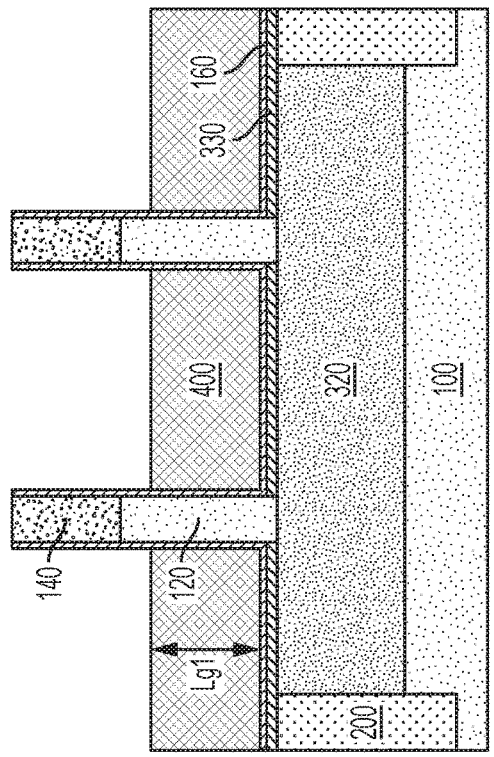
FIG. 3B shows the structure of FIG. 2A following removal of the lithography stack from over the fins within a second device region.
Figure 3A:
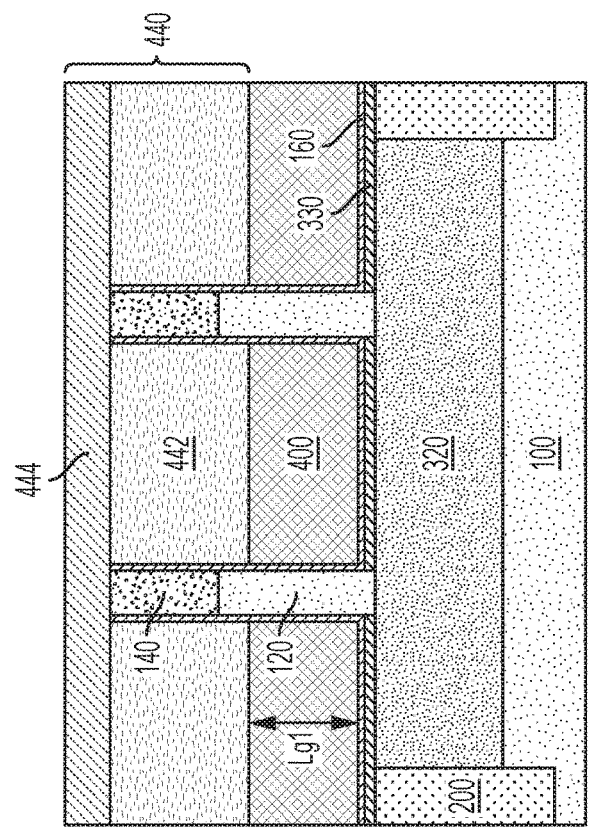
FIG. 3A depicts the formation of a lithography stack over the structure of FIG. 2A within a first device region.

Referring to FIGS. 3A and 3B, shown are a pair of fins 120 in each of a first device region (FIG. 3A) and a second device region (FIG. 3B) of the same semiconductor substrate 100. Within the first device region, a lithography stack 440 is formed over the structure. A lithography stack may include one or more of an optical planarization layer, an etch stop layer, an amorphous carbon layer, an adhesion layer, an oxide layer, and a nitride layer (not separately shown). Such layers may be configured as known to those skilled in the art to provide a suitable masking layer to protect the underlying layer(s).

Figure 4B:
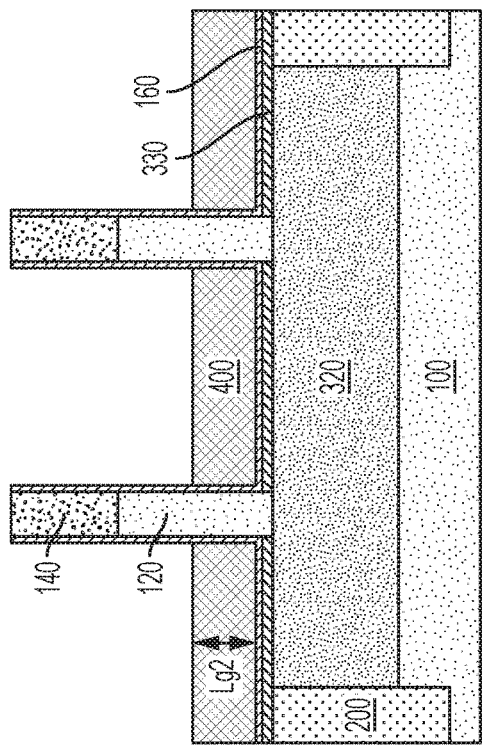
FIG. 4B shows the recess etch of the sacrificial gate within the second device region to form a sacrificial gate having a second gate length.
Figure 4A:
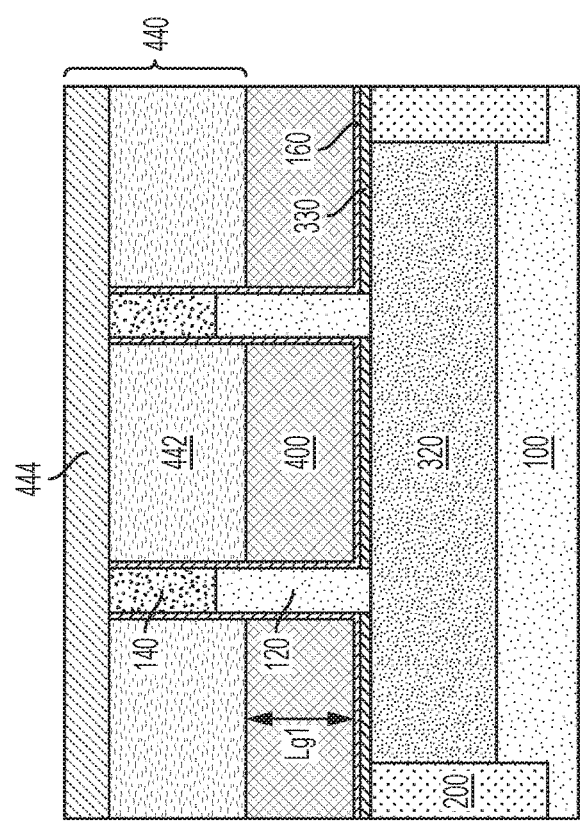
FIG. 4A shows retention of the lithography stack within the first device region during a recess etch of the sacrificial gate within the second device region to define a sacrificial gate having a second gate length.

In the illustrated embodiment, the lithography stack 400, including an organic layer 442 and a hard mask 444, is formed over the sacrificial gate 400 within the first device region (FIG. 3A), whereas the sacrificial gate 400 is exposed within the second device region (FIG. 3B). Using a directional etch, as shown in FIG. 4B, the exposed sacrificial gate 400 is uniformly etched within the second device region to define a second length Lg2, where Lg2<Lg1, while the protected sacrificial gate 400 within the first device region is unetched.

Figure 5A:
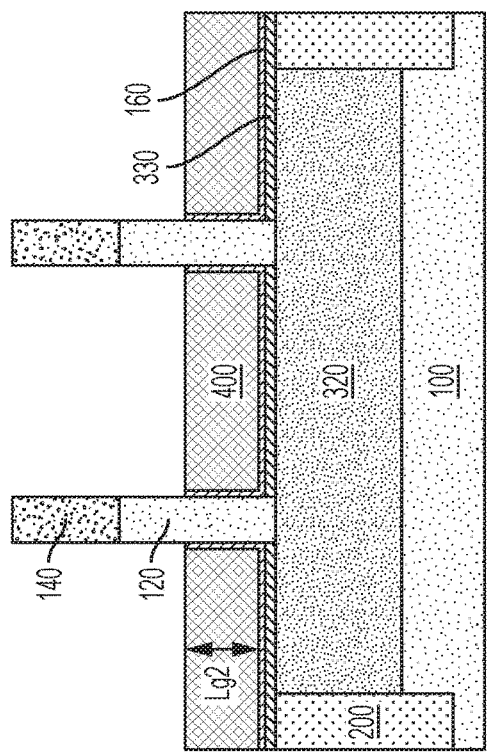
FIG. 5A depicts removal of the lithography stack and removal of exposed portions of the EG oxide from over the fins.
Figure 5B:
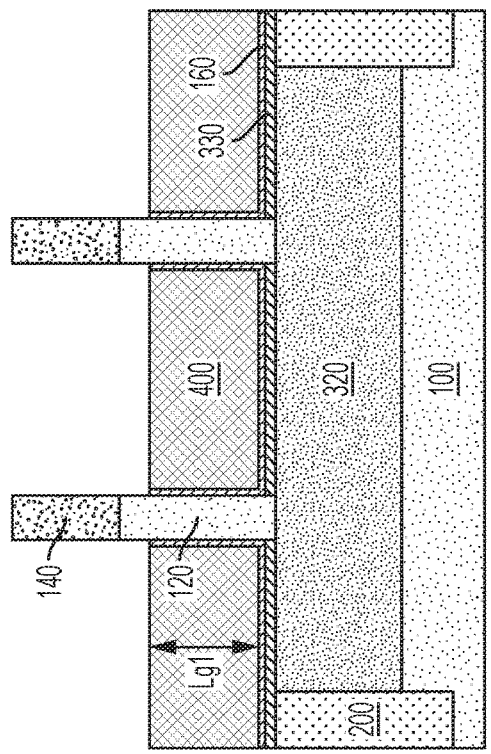
FIG. 5B depicts removal of exposed portions of the EG oxide from over the fins following the recess etch of the sacrificial gate within the second device region.

Referring to FIG. 5A, the lithography stack 440 is removed from the first device region, and as shown in FIGS. 5A and 5B, the portion of the EG oxide layer 160 extending above the sacrificial gate 400 within each device region is removed to expose the fins between the fin hard mask 140 and the sacrificial gate 400. The resulting structures include a first device region (FIG. 5A) having a sacrificial gate 400 with a first gate length (Lg1), and a second device region (FIG. 5B) having a sacrificial gate 400 with a second gate length (Lg2).

In various embodiments, a first gate length (Lg1) may range from 14 to 20 nm, while a second gate length (Lg2) may differ from the first gate length by 2 to 20%, e.g., 2, 5, 10, 15 or 20%, including ranges between any of the foregoing values. By way of example, a first device within the first device region may have a gate length (Lg1) of 16 nm, and a second device within the second device region may have a gate length (Lg2) of 14 nm. In a further example, a first device within a first device region may have a gate length (Lg1) of 20 nm, and a second device within a second device region may have a gate length (Lg2) of 16 nm.

In an alternate embodiment, as shown in FIG. 6A and FIG. 6B, rather than removing a portion of the sacrificial gate 400 within the second device region, after forming a lithography stack 440 within the first device region, a supplemental sacrificial gate 405 may be deposited within the second device region (FIG. 6B) to increase the gate length of the sacrificial gate within the second device region relative to the length of the sacrificial gate within the first device region. That is, the sacrificial gate 400 and the supplemental sacrificial gate 405 together form a composite sacrificial gate 400, 405. As will be appreciated, the portion of the supplemental sacrificial gate 405 deposited over the lithography stack 440 within the first device region (FIG. 6A) may be removed during the etching step(s) used to remove the lithography stack.

The supplemental sacrificial gate 405 may be formed by depositing a blanket dielectric layer over the sacrificial gate 400, which is planarized, e.g., using the fin hard mask 140 as a CMP stop layer, and etched back using a directional etch to form a supplemental sacrificial gate layer 405 having a uniform thickness.

In the illustrated embodiments a top surface of the sacrificial gate 400 within the first device region (FIG. 6A) is below a top surface of the fins 120, and a top surface of the supplemental sacrificial gate layer 405 within the second device region (FIG. 6B) is below a top surface of the fins 120.

Figure 7B:
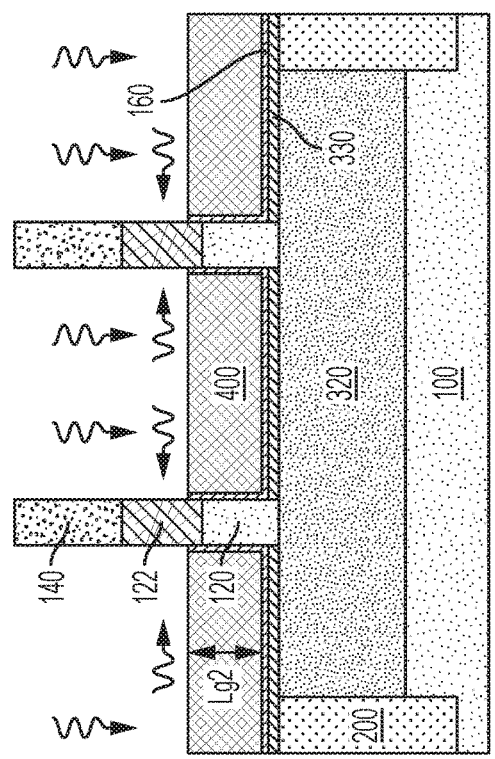
FIG. 7B depicts plasma doping of exposed portions of the fins above the recessed sacrificial gate within the second device region.
Figure 7A:
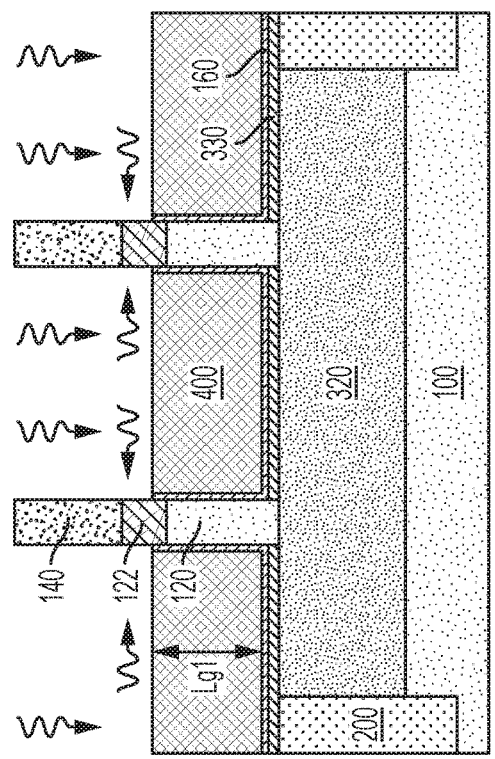
FIG. 7A depicts plasma doping of exposed portions of the fins above the sacrificial gate within the first device region.

Referring to FIG. 7A and FIG. 7B, using the sacrificial gate 400 as a block mask, the portions of fins 120 within the first and second device regions that extend above the sacrificial gate 400 are doped or amorphized in an amount effective to define a treated upper region 122 of each fin 120 that can be etched selectively with respect to the undoped (or crystalline) portion of the fin 120.

That is, by way of example, and according to various embodiments, the un-masked portions of the fins 120 may be plasma doped with arsenic or germanium, or amorphized by exposure to an ozone-containing plasma. As used here, an amorphous layer is less than 50 vol. % crystalline, and may include fully amorphous and partially amorphous structures. An annealing step may be used to diffuse dopant species into the fin 120 to form a treated portion 122 of the fin 120.

An exemplary plasma doping apparatus may be an RF-excited continuous plasma system utilizing a DC pulsed bias substrate. A doping method may use a doping gas mixture of arsine or germane gas and hydrogen at a substrate bias of 0 to 15 kV.

As used herein, the terms "selective" or "selectively" in reference to a material removal or etch process denote that the rate of material removal for a first material is greater than the rate of removal for at least another material of the structure to which the material removal process is applied. For example, in certain embodiments, a selective etch may include an etch chemistry that removes a first material selectively to a second material by a ratio of 2:1 or greater, 5:1, 10:1 or 20:1.

Referring to FIG. 8A and FIG. 8B, a conformal top spacer layer 530 is formed over the sacrificial gate 400 and over the fin hard mask 140, i.e., directly over exposed sidewalls of the treated portions 122 of fins 120. The methods and materials described above with reference to bottom spacer layer 330 may be used to form top spacer layer 530. The thickness of the top spacer layer 530 may range from 6 to 50 nm, e.g., 6, 10, 15, 20, 30, 40 or 50 nm, including ranges between any of the foregoing values.

A dielectric layer 550 is then formed over the top spacer layer 530 and planarized. In the illustrated embodiment, after planarization a top surface of the dielectric layer 550 is substantially co-planar with a top surface of the top spacer layer 530, and is disposed above a top surface of the fin hard mask 140. Dielectric layer 550 may include silicon dioxide, for example.

Figure 9B:
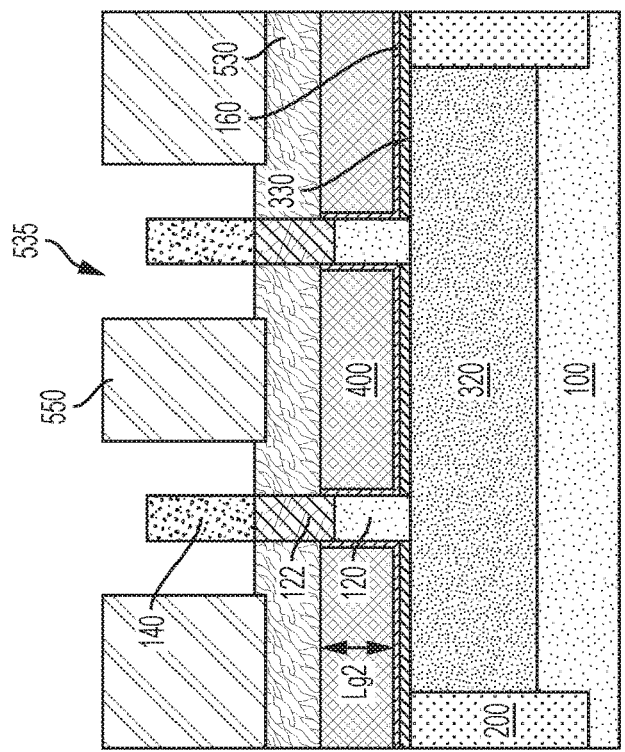
FIG. 9B depicts removal of the top spacer layer from over the fins and exposure of the fin hard mask.
Figure 9A:
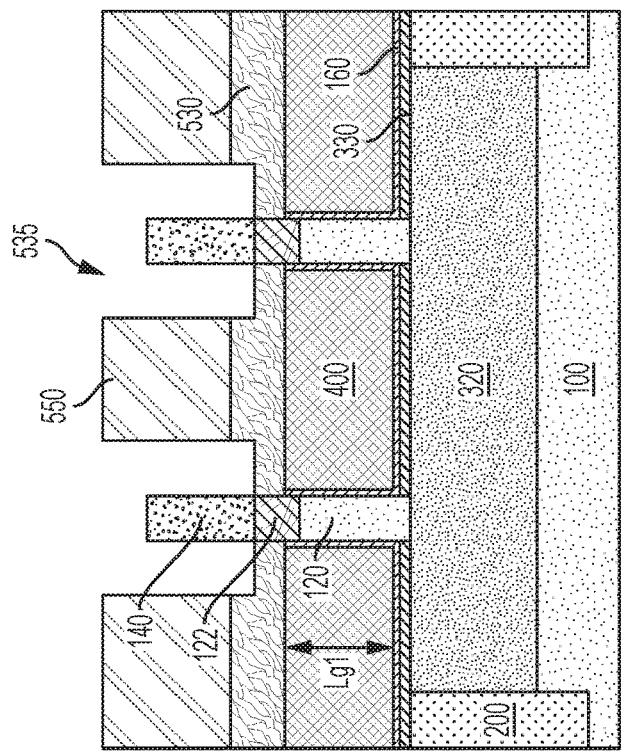
FIG. 9A depicts removal of the top spacer layer from over the fins and exposure of the fin hard mask.

Then, referring to FIG. 9A and FIG. 9B, portions of the top spacer layer overlying the fin hard mask 140 and laterally adjacent to the fin hard mask 140 are removed to form openings 535 where the top spacer layer 530 defines a bottom surface of the openings. The fin hard mask 140 is exposed within the opening 535. As used herein "lateral" and "laterally" refer to a direction parallel to a major surface of a substrate.

In the illustrated embodiment, a bottom surface of an opening 535 within first device region (FIG. 9A) is substantially co-planar with a bottom surface of an opening 535 within second device region (FIG. 9B).

Figure 10B:
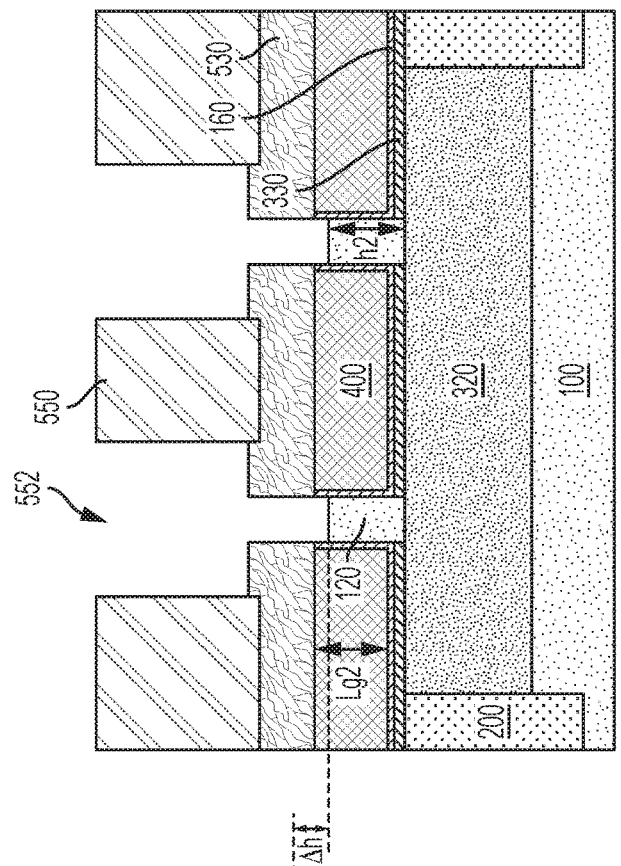
FIG. 10B shows removal of the fin hard mask and selective removal of the plasma doped portion of the fin within the second device region.
Figure 10A:
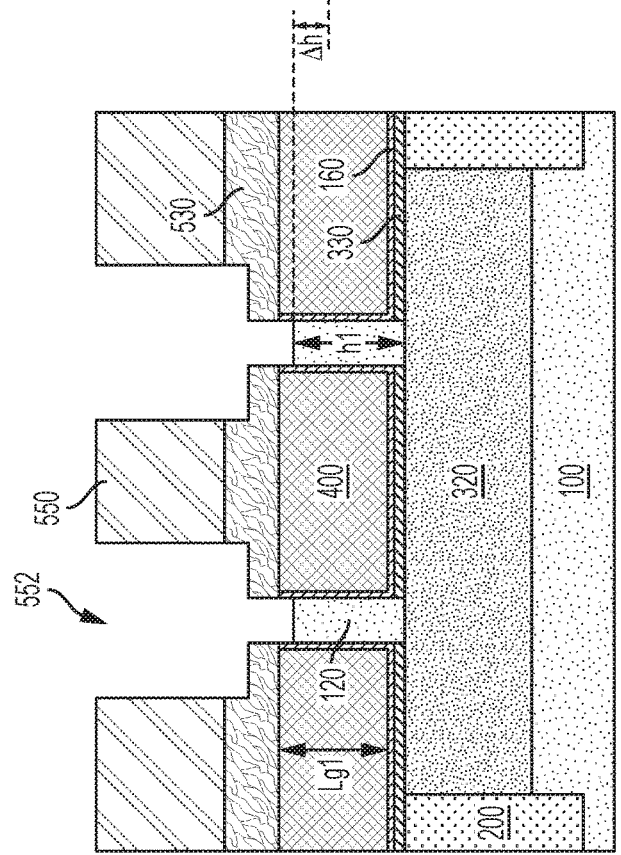
FIG. 10A shows removal of the fin hard mask and selective removal of the plasma doped portion of the fin within the first device region.

Removal of the fin hard mask 140 and selective removal of the treated portion 122 of each fin 120 within the first and second device regions is shown in FIG. 10A and FIG. 10B, respectively. In the current embodiment, a height (Lg1) of the sacrificial gate 400 within the first device region is greater than a height (Lg2) of the sacrificial gate 400 within the second device region. In various embodiments, a height (h1) of a fin 120 within the first device region is greater than a height (h2) of a fin within the second device region (h1−h2=Δh), where the top surface of each fin 120 is aligned to a top surface of the sacrificial gate 400 (or composite sacrificial gate 400, 405) within each device region.

After removal of the fin hard mask and removal of the treated portion 122 of the fins 120, an epitaxial or implanted top source/drain junction 620 is formed over the fins 120. The top source/drain junctions 620, which are aligned to the sacrificial gates within each device region, may define an epitaxial main layer and may be formed using the epitaxial methods and materials used to form the bottom source/drain junctions 320.

In certain embodiments, a highly-doped top source/drain junction 620 may be formed directly over a top surface of a fin 120. In alternate embodiments, due to the proximity of the top of a later-formed gate conductor to the top of a fin, improved control of the junction may be achieved by forming an epitaxial buffer layer 610 having a first dopant concentration directly over a top surface of a fin, and then forming a top source/drain junction 620 having a second dopant concentration over the buffer layer 610, where the second dopant concentration is greater than the first dopant concentration and the buffer layer 610 and the top/source drain region 620 include the same dopant.

For instance, in a p-type device the dopant may be boron while in an n-type device the dopant may be phosphorus, although other dopant species as known to those skilled in the art may be used. For either a p-type or an n-type device, the concentration of dopant with a buffer layer 610 (if provided) may be in the range of $1 \times 10^{18}$ to $5 \times 10^{19}/cm^3$, while the dopant concentration within a more highly-doped top source/drain junction 620 may be in the range of $1 \times 10^{20}$-$2 \times 10^{21}/cm^3$.

A nitride capping layer 630 is then deposited over the top source/drain junctions 620 to fill the openings 535, and a subsequent CMP step may be used to remove the overburden and planarize the structure such that a top surface of the nitride capping layer 630 is substantially co-planar with a top surface of dielectric layer 550. Nitride capping layer 630 may include silicon nitride, for example.

Referring to FIG. 12A and FIG. 12B, dielectric layer 550, sacrificial gate 400 and portions of the top spacer layer unmasked by nitride capping layer 630 can be removed using a selective, directional etch. In alternate (unillustrated) embodiments, a selective directional etch may be used to remove dielectric layer 550, composite sacrificial gate 400, 405, and portions of the top spacer 530 unmasked by capping layer 630.

Figure 13A:
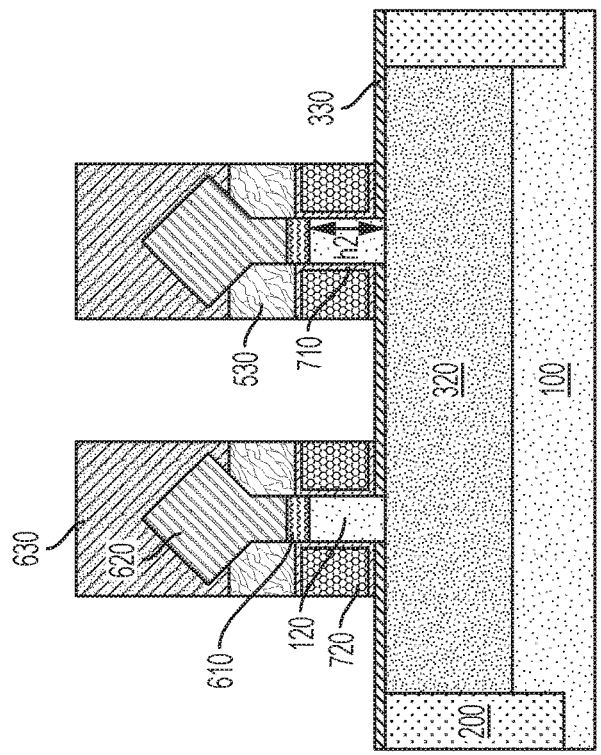
FIG. 13A depicts removal of EG oxide from over the fins, and the formation of a self-aligned gate stack having a first gate length within the first device region.
Figure 13B:
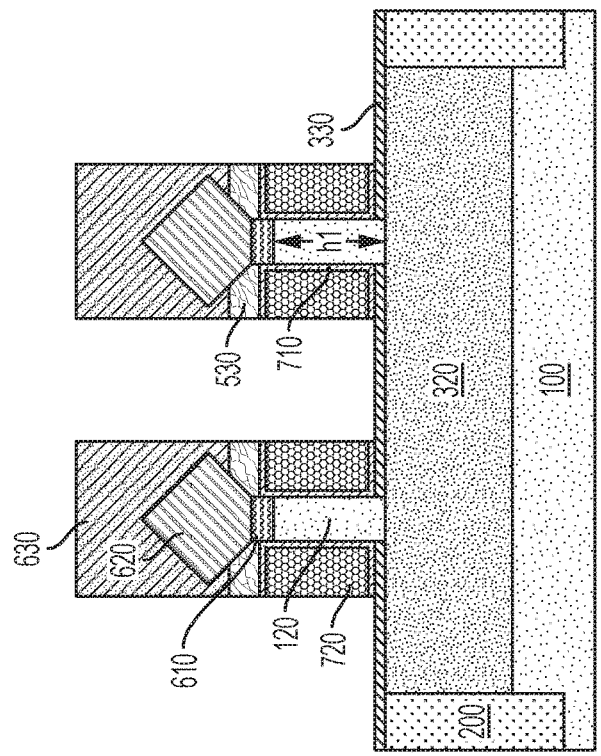
FIG. 13B depicts removal of EG oxide from over the fins, and the formation of a self-aligned gate stack having a second gate length within the second device region.

Referring to FIG. 13A and FIG. 13B, and in accordance with various embodiments, the EG oxide layer 160 may be removed prior to depositing a gate dielectric layer 710 and a self-aligned gate conductor 720 over the fins 120.

The gate dielectric layer 710, which may include a high-k dielectric layer, may be deposited conformally, e.g., over exposed sidewalls of the fins 120, as well as over a top surface of the bottom spacer 330 and over a bottom surface of the top spacer 530.

As used herein, a "high-k" material has a dielectric constant greater than that of silicon dioxide. A high-k dielectric may include a binary or ternary compound such as hafnium oxide ($HfO_2$). Further exemplary high-k dielectrics include, but are not limited to, $ZrO_2$, $La_2O_3$, $Al_2O_3$, $TiO_2$, $SrTiO_3$, $BaTiO_3$, $LaAlO_3$, $Y_2O_3$, $HfO_xN_y$, $HfSiO_xN_y$, $ZrO_xN_y$, $La_2O_xN_y$, $Al_2O_xN_y$, $TiO_xN_y$, $SrTiO_xN_y$, $LaAlO_xN_y$, $Y_2O_xN_y$, $SiO_xN_y$, $SiN_x$, a silicate thereof, and an alloy thereof. Each value of x may independently vary from 0.5 to 3, and each value of y may independently vary from 0 to 2.

The gate dielectric layer 710 may be deposited by a suitable process such as atomic layer deposition (ALD), chemical vapor deposition (CVD), physical vapor deposition (PVD), thermal oxidation, UV-ozone oxidation, or combinations thereof. The gate dielectric layer thickness may range from 1 nm to 10 nm, e.g., 1, 2, 4, 6, 8 or 10 nm, including ranges between any of the foregoing.

Deposition of the gate conductor 720 may include atomic layer deposition (ALD) or chemical vapor deposition (CVD). The gate conductor layer 720 is formed over the gate dielectric layer 710, followed by an anisotropic etch using the nitride cap 630 as an etch mask. Thus, the gate conductor 720 is self-aligned beneath the nitride cap 630 and remaining portions of the top spacer 530. The gate conductor 720 may include titanium, titanium nitride, aluminum, and the like, as well as multiple layers thereof. In the illustrated structure, a bottom surface of the source/drain junction 620 within the first device region (FIG. 13A) is vertically displaced from (e.g., higher than, relative to a top surface of the substrate) a bottom surface of the second source/drain junction 620 within the second device region (FIG. 13B).

Disclosed are methods of manufacturing a vertical fin field effect transistor (VFinFET) that include forming a first fin in a first device region of a substrate and forming a second fin in a second device region of the substrate. A sacrificial gate having a first gate length is then formed over sidewalls of the first and second fins. After forming a block mask over the sacrificial gate within the first device region, a deposition step or an etching step is used to increase or decrease the gate length of the sacrificial gate within the second device region. Top source/drain junctions are formed over the fins and are self-aligned to a respective gate in each of the first and second device regions.

As used herein, the singular forms "a," "an" and "the" include plural referents unless the context clearly dictates otherwise. Thus, for example, reference to a "gate dielectric layer" includes examples having two or more such "gate dielectric layers" unless the context clearly indicates otherwise.

Unless otherwise expressly stated, it is in no way intended that any method set forth herein be construed as requiring that its steps be performed in a specific order. Accordingly, where a method claim does not actually recite an order to be followed by its steps or it is not otherwise specifically stated in the claims or descriptions that the steps are to be limited to a specific order, it is no way intended that any particular order be inferred. Any recited single or multiple feature or aspect in any one claim can be combined or permuted with any other recited feature or aspect in any other claim or claims.

It will be understood that when an element such as a layer, region or substrate is referred to as being formed on, deposited on, or disposed "on" or "over" another element, it can be directly on the other element or intervening elements may also be present. In contrast, when an element is referred to as being "directly on" or "directly over" another element, no intervening elements are present.

While various features, elements or steps of particular embodiments may be disclosed using the transitional phrase "comprising," it is to be understood that alternative embodiments, including those that may be described using the transitional phrases "consisting" or "consisting essentially of," are implied. Thus, for example, implied alternative embodiments to a semiconductor fin that comprises silicon include embodiments where a semiconductor fin consists essentially of silicon and embodiments where a semiconductor fin consists of silicon.

It will be apparent to those skilled in the art that various modifications and variations can be made to the present invention without departing from the spirit and scope of the invention. Since modifications, combinations, sub-combinations and variations of the disclosed embodiments incorporating the spirit and substance of the invention may occur to persons skilled in the art, the invention should be construed to include everything within the scope of the appended claims and their equivalents.

What is claimed is:

1. A method of making a vertical FinFET device comprising:
    forming a plurality of fins over a semiconductor substrate;
    forming a bottom source/drain region over the substrate and adjacent to the fins;
    forming a sacrificial gate having a first gate length over the substrate and surrounding the fins;
    forming a block mask over the sacrificial gate within a first device region of the substrate;
    modifying the sacrificial gate within a second device region of the substrate to form a second gate length different from the first gate length;
    treating portions of the fins disposed above the sacrificial gate after modifying the sacrificial gate within the second device region to form treated regions;
    etching the treated regions of the fins selectively with respect to untreated regions of the fins to remove the treated regions; and
    forming a top source/drain region over the untreated regions of the fins.

2. The method of claim 1, wherein the modifying comprises etching the sacrificial gate within the second device region to decrease the first gate length to the second gate length.

3. The method of claim 2, wherein the second gate length is 2% to 20% less than the first gate length.

4. The method of claim 1, wherein the modifying comprises forming a supplemental gate over the sacrificial gate in the second device region.

5. The method of claim 4, wherein the sacrificial gate thickness and the supplemental sacrificial gate thickness together define the second gate length and the second gate length is 2% to 20% greater than the first gate length.

6. The method of claim 1, wherein the treating comprises plasma doping or amorphizing.

7. The method of claim 1, further comprising forming a top spacer layer over sidewalls of the treated regions of the fins prior to selectively etching the treated regions of the fins.

8. The method of claim 1, wherein forming the top source/drain region comprises forming an epitaxial buffer layer having a first dopant content directly over each untreated region, and forming an epitaxial main layer having a second dopant content greater than the first dopant content directly over the epitaxial buffer layer.

9. The method of claim 1, further comprising:
    removing the block mask from within the first device region;
    removing the sacrificial gate from within the first and second device regions; and
    forming a gate stack over sidewalls of the fins, wherein the gate stack comprises a gate dielectric layer formed directly over the fins and a gate conductor formed over the gate dielectric layer.

10. A method of making a vertical FinFET device comprising:
    forming a plurality of fins over a semiconductor substrate;
    forming a bottom source/drain region over the substrate and adjacent to the fins;
    forming a sacrificial gate having a first gate length over the substrate and surrounding the fins;
    forming a block mask over the sacrificial gate within a first device region of the substrate;
    modifying the sacrificial gate within a second device region of the substrate to form a second gate length different from the first gate length;
    removing the block mask from within the first device region;
    treating portions of the fins disposed above the sacrificial gate within the first device region and the second device region after modifying the sacrificial gate within the second device region to form treated regions;
    etching the treated regions of the fins selectively with respect to untreated regions of the fins to remove the treated regions;
    forming a top source/drain region over the untreated regions of the fins;
    removing the sacrificial gate from within the first and second device regions; and
    forming a gate stack over sidewalls of the fins, wherein the gate stack comprises a gate dielectric layer formed directly over the fins and a gate conductor formed over the gate dielectric layer.

11. The method of claim 10, wherein the gate length of the sacrificial gate within the second device region is 2% to 20% less than the gate length of the sacrificial gate within the first device region.

12. The method of claim 10, wherein treating the portions of the fins disposed above the sacrificial gate comprises doping to form a doped region within each fin.

13. The method of claim 12, wherein the doping is performed after modifying the sacrificial gate within the second device region.

14. The method of claim 12, wherein the fins are doped with arsenic.

15. The method of claim 12, wherein the top source/drain region is formed directly over an undoped region of each of the fins.

16. A method of making a vertical FinFET device comprising:
   forming a plurality of fins over a semiconductor substrate in a first and a second device region;
   forming a bottom source/drain region over the substrate and adjacent to the fins;
   forming a sacrificial gate having a first gate length over the substrate and surrounding the fins;
   modifying the sacrificial gate within the second device region of the substrate to have a second gate length different from the first gate length within the first device region;
   removing portions of the fins disposed above the sacrificial gate;
   forming a top source/drain region over the remaining portions of the fins;
   removing the sacrificial gate from within the first and second device regions; and
   forming a gate stack over sidewalls of the fins, wherein the gate stack comprises a gate dielectric layer formed directly over the fins and a gate conductor formed over the gate dielectric layer.

17. The method of claim 16, wherein modifying the sacrificial gate comprises etching the sacrificial gate within the second device region to have the second gate length less than the first gate length.

18. The method of claim 16, wherein modifying the sacrificial gate comprises forming a supplemental gate over the sacrificial gate in the second device region.

19. The method of claim 16, wherein removing portions of the fins comprises:
   treating portions of the fins disposed above the sacrificial gate within the first device region and the second device region after modifying the sacrificial gate within the second device region to form treated regions; and
   etching the treated regions of the fins selectively with respect to untreated regions of the fins to remove the treated regions.

* * * * *